United States Patent [19]

Marcantonio

[11] Patent Number: 4,710,798
[45] Date of Patent: Dec. 1, 1987

[54] INTEGRATED CIRCUIT CHIP PACKAGE

[75] Inventor: Gabriel Marcantonio, Nepean, Canada

[73] Assignee: Northern Telecom Limited, Montreal, Canada

[21] Appl. No.: 775,277

[22] Filed: Sep. 12, 1985

[51] Int. Cl.[4] .................. H01L 23/02; H01L 23/12; H01L 23/48

[52] U.S. Cl. ........................ 357/80; 357/72; 357/68

[58] Field of Search ............ 357/80, 72, 75, 67, 357/74, 68

[56] References Cited

U.S. PATENT DOCUMENTS

| 3,388,301 | 6/1968 | James | 357/80 |
| 3,400,383 | 9/1968 | Meadows et al. | 357/75 |
| 3,621,564 | 11/1971 | Tanaka et al. | 357/67 |
| 4,074,342 | 2/1978 | Honn et al. | 357/80 |
| 4,126,879 | 11/1978 | Kessler et al. | 357/75 |

FOREIGN PATENT DOCUMENTS 52-77684  6/1977  Japan ................... 357/79

OTHER PUBLICATIONS

"High Density, Low Temperature Solder Reflow Bonding of Silicon Chips to Plastic Substrates"—Kuhn et al.—IBM Tech. Disclosure Bulletin, vol. 18, No. 10, 3/1976.
"Active Silicon Chip Carrier"—Bodendorf et al.—IBM Tech. Disclosure Bulletin, vol. 15, No. 2, Jul. 1972, pp. 656–657.

Primary Examiner—Andrew J. James
Assistant Examiner—S. V. Clark
Attorney, Agent, or Firm—Schwartz, Jeffery, Schwaab, Mack, Blumenthal & Evans

[57] ABSTRACT

An integrated circuit is mounted on, and electrically connected to an underlying substrate by the flip-chip technique. In this technique, the chip is inverted and bonding pads on the chip are soldered to correspondingly located bonding pads on the substrate. By the invention a continuous ribbon or loop of solder or polymer extends between the chip and substrate surfaces and defines a sealed cavity. Because the interior of the cavity is sealed from contaminants, conducting leads of the chip or substrate can be left uncovered within the cavity so reducing the capacitance of high frequency circuits. The substrate can be a connection medium such as a printed circuit board or could be another integrated circuit chip.

12 Claims, 2 Drawing Figures 4,710,798

INTEGRATED CIRCUIT CHIP PACKAGE

BACKGROUND OF THE INVENTION

In a conventional method of mounting integrated circuits, wire bonds are made from bonding pads on the chip to terminals mounted in a package. Terminal pins projecting from the package are mounted within holes in a printed circuit board. The board provides physical support for the chip package and the printed circuit electrically connects the chip to other components in an electronic circuit.

In an alternative packaging technology called the "flip chip" technique, the chip is inverted so that bonding pads on the chip surface face downwardly towards the substrate and corresponding bonding pads are formed on the upper surface of the substrate. Solder bridges are made between the bonding pads on the chip and bonding pads on the substrate to afford both mechanical and electrical connection.

In these known packaging techniques, it is known to coat the exposed upper surface of the chip with a layer of dielectric such as phosphosilicate glass (PSG). The phosphosilicate glass acts to protect the chip from corrosion and ionic contamination by materials which can alter the performance of the circuit.

A problem with high frequency circuits is that an overlying protective dielectric layer can increase the capacitance of aluminum conductors at the chip surface. To reduce the capacitance it is known to fabricate a hermetically sealed integrated circuit package in which an air space exists between the top layer conductor and a protective cap positioned over the integrated circuit chip.

A modification of the flip-chip packaging method particularly adapted for high frequency circuits is now proposed.

SUMMARY OF THE INVENTION

According to the invention there is provided an integrated circuit chip package comprising an integrated circuit chip having a plurality of conducting leads extending between elements of the integrated circuit and bonding pads on a surface thereof, a substrate having a plurality of conducting leads extending between terminals of the package and a plurality of bonding pads on a surface of the substrate, said surface of the substrate facing said surface of the chip, a plurality of connections extending between the bonding pads on the chip and respective bonding pads on the substrate, and a continuous loop of material bridging said chip surface and said substrate surface throughout the length of the loop and defining a cavity, at least some of the conducting leads on one or other of the surfaces within the cavity being devoid of any covering.

Preferably the connections are bridges of solder establishing both an electrical and mechanical connection between the bonding pads on the chip and substrate. The substrate can itself be an integrated circuit chip, one of the chips being larger than the other so as to expose bonding pads along a margin of the larger area chip. Alternatively the substrate is a multilayer metal/insulator interconnection medium fabricated on a silicon substrate as described in our copending patent application MO-18. The loop or ribbon can be made of a solder and can provide an electical connection, for example a ground connection, between the integrated circuit and the substrate. Alternatively the ribbon is made of an insulating polymeric material. The loop can be deposited during fabrication of the integrated circuit chip or simultaneously with assembly of a chip relative to an underlying chip or interconnection medium.

BRIEF DESCRIPTION OF THE DRAWINGS

An embodiment of the invention will now be described by way of example with reference to the accompanying drawings in which.

DETAILED DESCRIPTION OF THE PREFERRED EMBODIMENTS

Figure 1:
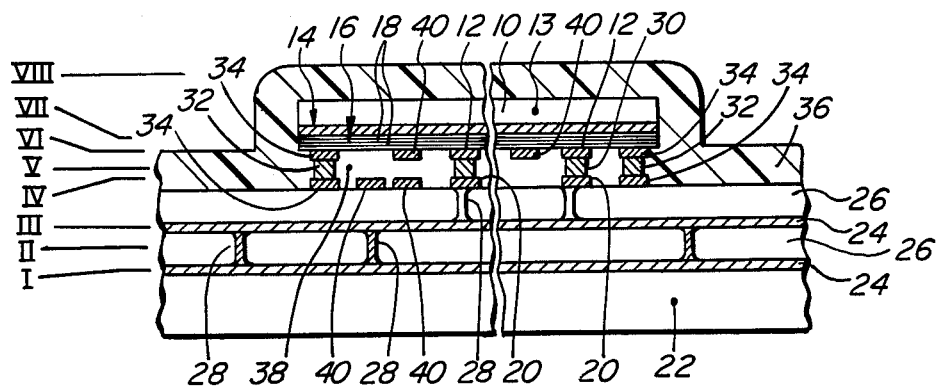
FIG. 1 is a sectional view, not-to-scale, showing part of an integrated circuit packaged in a manner according to the invention.

Referring in detail to the drawings, there is shown part of an integrated circuit chip 10 having at its lower surface an array of bonding pads 12. Although details of the chip are not shown, it will be understood that the chip is a conventional integrated circuit chip fabricated for example on a silicon substrate 13 on which various transistors and other circuit elements are formed and occupy a layer 14. Input, output, ground and power connections to the circuit elements are made by conducting patterns which may occupy one or more levels shown schematically at 16, the patterns formed on the silicon substrate are separated from one another and from the substrate 13 by dielectric layers 18. Circuits including the conducting patterns and circuit elements within the silicon extend to the surface of the wafer which, as shown in FIG. 1, is the wafer lower surface. The conducting paths at the wafer surface terminate at square areas of aluminum film which function as bonding pads 12.

Corresponding bonding pads 20 in an identical pattern are also formed on an underlying substrate material 22 which, as described in our copending patent application MO-18 may be an interconnect medium having a silicon substrate and multiple alternating layers of aluminum and dielectric respectively 24 and 26 formed on the substrate. Conducting patterns are etched into the aluminum, and individual regions of the conducting patterns are vertically connected to underlying or overlying aluminum regions by vias through intermediate dielectric, the vias being shown schematically at 28.

The bonding pads 12 are fixed to bonding pads 20 to establish both physical and electrical connection by using solder bridges 30. In addition to the solder connections, a further solder connection 32 of ribbon form is provided around the perimeter of the integrated circuit chip 10. The loop of solder is applied by plating or evaporation to the chip surface at the same time as solder beads for interconnection to the substrate. The chip is then inverted and mounted with the solder bearing surface close to the interconnection substrate. The chip and substrate are passed into a solder reflow zone where the solder is melted. The beads of solder establish electrical connections between the chip and the substrate. Within the loop of solder is formed a small hermetically sealed cavity. In the example shown in FIG. 1, the material used in the ribbon is identical with that used in the solder electrical connections. Examples of suitable alloys are 95:5 tin:silver, 62:36:2 tin:lead:silver, and indium. The loop or ribbon extends between corresponding loop-shaped aluminum bonding pads 34 formed both on the integrated circuit and the silicon interconnect substrate. Using the solder interconnections the integrated circuit chip is separated from the silicon substrate by from 2 to 10 microns depending on the circuit topography.

After the integrated circuit chip 10 has been fixed in position it can be protected by depositing a polymer conformal coating or phosphosilicate glass 36 over the back surface of the chip and the exposed area of the silicon interconnection substrate 22.

The ribbon 32 of solder produces a hermetically sealed cavity 38 between the integrated circuit chip 10 and the underlying silicon interconnect substrate 22. As previously indicated, the hermetically sealed cavity is important to prevent contamination of exposed parts of the semiconductor or conducting patterns of the chip. The provision of an air gap is particularly advantageous in high frequency circuits since conducting regions 40 have an air interface so minimizing circuit capacitance. If the conductors were covered by a solid protecting layer, such as phosphosilicate glass, device capacitance would be high.

Figure 2:
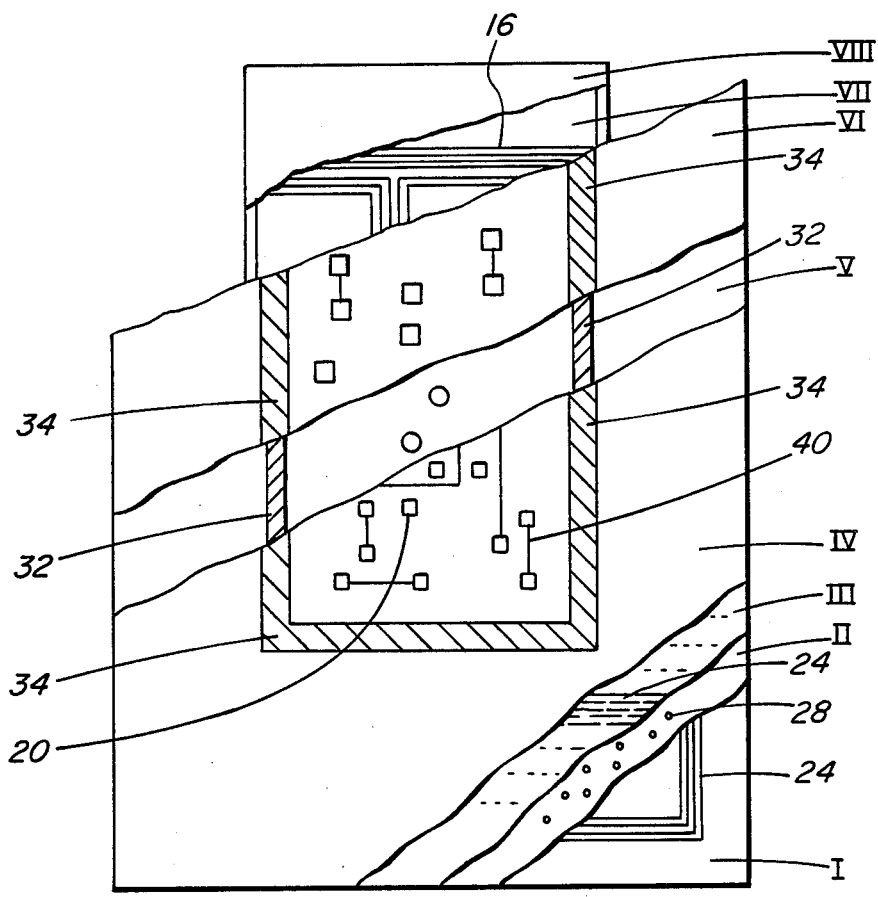
FIG. 2 is a plan view illustrating various levels of the package of FIG. 1.

In alternatives to the FIGS. 1 and 2 embodiment, the silicon interconnect substrate is replaced by a second integrated circuit, one of the chips having an area larger than the other chip so as to expose a marginal region. Bonding pads are formed along the exposed margin, the bonding pads connected via leads on the larger chip to a substrate, for example, a conventional printed wiring board.

In a further embodiment (not shown), the thin film ribbon around the perimeter of the chip is replaced by a loop or ribbon of polymer which can be insulating or conducting depending on whether the loop is required to function as part of an electrical circuit.

What is claimed is:

1. An integrated circuit chip package comprising:
    an integrated circuit chip having a plurality of circuit elements contained therein, said circuit elements being electrically extended to a plurality of bonding pads on a surface thereof,
    a substrate having a plurality of bonding pads on a surface of the substrate, said surface of the substrate facing said surface of the chip,
    a connection extending from selected bonding pads on the chip to corresponding bonding pads on the substrate, and
    material extending from said chip surface to said substrate surface for defining a perimeter of a sealed cavity formed between said chip surface and said substrate surface.

2. A package as claimed in claim 1, wherein said substrate is an integrated circuit.

3. A package as claimed in claim 1, wherein said substrate is an interconnection medium having a semiconductor substrate and, formed thereon, a multilayer structure comprising alternating layers of dielectric and conductor, the conducting layers etched into conducting patterns wherein selected regions of said conducting patterns are connected to each other and to the bonding pads of said substrate through vias in the dielectric layers.

4. A package as claimed in claim 1, wherein said material is solder material.

5. A package as claimed in claim 1, wherein said material and the bonding pads on the chip are laterally spaced regions of a common metallic film.

6. A package as claimed in claim 4, wherein the solder is a 95:5 tin:silver solder.

7. A package as claimed in claim 4, wherein the solder provides a sealing connection between first and second perimeter bonding pads formed respectively on said chip surface and said substrate surface.

8. A package as claimed in claim 1, wherein said material is a polymer.

9. A package as claimed in claim 1, wherein said connection is an electrical connection.

10. A package as claimed in claim 1, wherein said connection is a mechanical connection.

11. A package as claimed in claim 1, wherein said connection is an electrical and a mechanical connection.

12. A package as claimed in claim 1, wherein said sealed cavity encloses air.

* * * * *